(12) United States Patent
Higashi et al.

(10) Patent No.: US 7,701,984 B2
(45) Date of Patent: Apr. 20, 2010

(54) LASER MODULE AND METHOD OF CONTROLLING WAVELENGTH OF EXTERNAL CAVITY LASER

(75) Inventors: Toshio Higashi, Yamanashi (JP); Yasuyuki Yamauchi, Yamanashi (JP); Emmanuel le Taillandier de Gabory, Kanagawa (JP); Hirokazu Tanaka, Yamanashi (JP); Junji Watanabe, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 3 days.

(21) Appl. No.: 11/878,706

(22) Filed: Jul. 26, 2007

(65) Prior Publication Data

US 2007/0268568 A1 Nov. 22, 2007

Related U.S. Application Data

(63) Continuation of application No. PCT/JP2006/301288, filed on Jan. 27, 2006.

(30) Foreign Application Priority Data

Jan. 27, 2005 (JP) .............................. 2005-019597

(51) Int. Cl.
 *H01S 3/10* (2006.01)
 *H01S 3/08* (2006.01)

(52) U.S. Cl. ......................................... 372/20; 372/92

(58) Field of Classification Search ................... 372/20, 372/29.01, 29.02
See application file for complete search history.

(56) References Cited

U.S. PATENT DOCUMENTS

| 5,949,804 | A   | 9/1999  | Okazaki |
|-----------|-----|---------|---------|
| 6,205,159 | B1* | 3/2001  | Sesko et al. ..................... 372/20 |
| 6,526,071 | B1* | 2/2003  | Zorabedian et al. ........... 372/20 |
| 6,665,321 | B1* | 12/2003 | Sochava et al. ................ 372/20 |
| 6,845,121 | B2* | 1/2005  | McDonald ..................... 372/34 |
| 6,853,654 | B2* | 2/2005  | McDonald et al. ............. 372/20 |

(Continued)

FOREIGN PATENT DOCUMENTS

JP 4-142090 A 5/1992

(Continued)

OTHER PUBLICATIONS

International Search Report of PCT/JP2006/301288, date of filing Mar. 20, 2006.

*Primary Examiner*—Armando Rodriguez
*Assistant Examiner*—Phillip Nguyen
(74) *Attorney, Agent, or Firm*—Westerman, Hattori, Daniels & Adrian, LLP

(57) ABSTRACT

A laser module has an optical amplifier, a first etalon and a wavelength selectable mirror. The first etalon has wavelength peaks at a given wavelength interval in transmission characteristics and transmits a light from the optical amplifier. The wavelength peaks are tunable. The wavelength selectable mirror acts as an external mirror of an external cavity laser including the optical amplifier, and has a relatively high reflection intensity at a part of wavelength range in an effective gain range of the optical amplifier. The effective gain range of the optical amplifier includes more than one wavelength peak of the first etalon. A reflection bandwidth where the wavelength selectable mirror has a relatively high reflection intensity is less than twice of the wavelength interval of the wavelength peaks of the first etalon.

19 Claims, 10 Drawing Sheets

U.S. PATENT DOCUMENTS

| | | | |
|---|---|---|---|
| 2002/0172239 A1* | 11/2002 | McDonald et al. | 372/20 |
| 2003/0179790 A1* | 9/2003 | Bouda et al. | 372/20 |
| 2005/0105568 A1* | 5/2005 | Smart | 372/25 |
| 2005/0111498 A1* | 5/2005 | Daiber et al. | 372/20 |
| 2005/0135439 A1* | 6/2005 | Chapman et al. | 372/20 |
| 2005/0265402 A1* | 12/2005 | Tanaka et al. | 372/20 |
| 2005/0276303 A1* | 12/2005 | Huang | 372/106 |

FOREIGN PATENT DOCUMENTS

| | | |
|---|---|---|
| JP | 9-260792 A | 10/1997 |
| JP | 9-307160 A | 11/1997 |
| JP | 10-190105 A | 7/1998 |
| JP | 2003-152275 A | 5/2003 |
| JP | 2003-283044 A | 10/2003 |

* cited by examiner

WAVELENGTH WHERE PEAKS CORRESPOND IS SELECTED

EFFECTIVE GAIN RANGE

36nm

LASER MODULE AND METHOD OF CONTROLLING WAVELENGTH OF EXTERNAL CAVITY LASER

BACKGROUND OF THE INVENTION

1. Field of the Invention

This invention generally relates to a laser module and a method of controlling wavelength of an external cavity laser.

2. Description of the Related Art

Recently, an information-processing device and so on using a semiconductor laser have been developed. There is a demand for superior characteristics such as tunability or stability of wavelength. And so, Japanese Patent Application Publication No. 2003-152275 (hereinafter referred to as Document 1) discloses an art in which a wavelength selectable etalon whose inclination is tunable is provided between a semiconductor optical amplifier and an external mirror.

In accordance with the art, peak wavelengths of a light passing through an etalon change when the inclination of the etalon is changed. And, an effective gain range of the semiconductor optical amplifier includes one of the peak wavelengths. Therefore, an output wavelength of the semiconductor optical amplifier is selected to the peak wavelength of the light passing through the etalon.

However, the art disclosed in Document 1 has a problem that a full width of half maximum (FWHM) value of the peak of the light passing through the etalon is broadened when a Free Spectral Range (FSR) of the etalon is broadened so that the effective gain range of the semiconductor optical amplifier includes only one of the peak wavelengths of the light passing through the etalon. In contrast, the effective gain range of the semiconductor optical amplifier includes more than one peak of the light passing through the etalon when the FSR is reduced in order to reduce the half-value-width of the peak of the light passing through the etalon. Therefore, the selection accuracy of output wavelength of the external cavity laser is degraded.

SUMMARY OF THE INVENTION

Various aspects of this invention have been made in view of the above-mentioned circumstances. The present invention provides a laser module and a method of controlling wavelength of an external cavity laser that are capable of selecting an output wavelength accurately.

According to an aspect of the present invention, preferably, there is provided a laser module including an optical amplifier, a first etalon, and a wavelength selectable mirror. The first etalon has wavelength peaks at a given wavelength interval in transmission characteristics and transmits a light from the optical amplifier. The wavelength peaks are tunable. The wavelength selectable mirror acts as an external mirror of an external cavity laser including the optical amplifier, and has a relatively high reflection intensity at a part of wavelength range in an effective gain range of the optical amplifier. The effective gain range of the optical amplifier includes more than one wavelength peak of the first etalon. A reflection bandwidth where the wavelength selectable mirror has a relatively high reflection intensity is less than twice of the wavelength interval of the wavelength peaks of the first etalon.

In the laser module in accordance with the present invention, a light is amplified by the optical amplifier. The light from the optical amplifier has wavelength peaks at the wavelength interval when passing through the first etalon. A light of a part of wavelength range in the effective gain range is reflected by the wavelength selectable mirror. In this case, peak wavelengths of a light passing through the first etalon are limited by the wavelength selectable mirror. And, it is possible that the wavelength selectable mirror reflects one etalon peak, when the wavelength of the etalon peak is adjusted. The wavelength selection accuracy of outputting light of the laser module is, therefore, improved.

The wavelength selectable mirror may have a structure in which dielectric layers are laminated. The dielectric layers may have a thickness of a substantially ¼ of a central wavelength of a desirable reflected light. In this case, a light having a desirable central wavelength is reflected by the wavelength selectable mirror. The wavelength selection accuracy of outputting light of the laser module is, therefore, improved.

The wavelength peaks of the first etalon may be adjusted based on an inclination of the first etalon with respect to an incident light. In this case, it is possible that the wavelength selectable mirror reflects a light having a desirable peak wavelength when the inclination of the first etalon with respect to the incident light is adjusted.

The first etalon may include a liquid crystal that has a refractive-index tunability according to a voltage applied thereto. The wavelength peaks of the first etalon may change according to the voltage applied to the first etalon. In this case, it is possible that the wavelength selectable mirror reflects a light having a desirable peak wavelength when a voltage is applied on the first etalon.

The laser module may further include a second etalon having wavelength peaks at a given wavelength interval in transmission characteristics and being arranged between the optical amplifier and the wavelength selectable mirror. The wavelength peaks of the second etalon may be fixed or tunable. In this case, it is possible to improve the wavelength selection accuracy by using the first etalon and the second etalon, additionally.

The wavelength interval of etalon peaks of the second etalon may be different from those of the first etalon. In this case, a half-value width of peak wavelengths of a light passing through the first etalon and the second etalon is reduced. It is, therefore, possible to improve the wavelength selection accuracy.

The optical amplifier may be a semiconductor optical amplifier. The laser module may further include a phase shifter being arranged between the optical amplifier and the wavelength selectable mirror and controlling a phase of a light passing therethrough when a refractive-index thereof is changed. In this case, it is possible to adjust peak wavelengths of the light passing through the first etalon and the second etalon. It is thus possible to improve the wavelength selection accuracy.

The phase shifter may be composed of a semiconductor integrated with the optical amplifier. The laser module may further include a temperature control device having the optical amplifier, the wavelength selectable mirror and the first etalon arranged thereon. In this case, it is possible to keep the temperatures of the optical amplifier, the wavelength selectable mirror and the etalon constant. It is thus possible to improve the wavelength selection accuracy.

The laser module may further include a wavelength detection portion that detects an output wavelength of the external cavity laser. A refractive-index of the phase shifter may be adjusted based on a detection result of the wavelength detection portion. In this case, it is possible to adjust peak wavelengths of the light passing through the first etalon and the second etalon. It is thus possible to improve the wavelength selection accuracy.

The laser module may further include a shutter that transmits or shuts an outputting light. The shutter may include a liquid crystal and may transmit or shut the outputting light based on a voltage applied on the liquid crystal. In this case, it is possible to stop outputting an unstable laser light when a wavelength, an output, a phase and so on of a laser light are adjusted.

The reflection bandwidth may include one peak wavelength of a light passing through the first etalon and the second etalon. And at least a part of the light passing through the first etalon and at least a part of the light passing through the second etalon may be overlapped in the reflection bandwidth. In this case, a half-value width of peak wavelengths of the light passing through the first etalon and the second etalon is reduced. It is thus possible to improve the wavelength selection accuracy.

According to another aspect of the present invention, preferably, there is provided a method of controlling wavelength of an external resonator laser, including a step of controlling an etalon so that wavelength peaks at a given wavelength interval of the etalon is within a range where an effective gain range of the optical amplifier and a reflection bandwidth of a wavelength selectable mirror are overlapped and that the external cavity laser oscillates. The external cavity laser includes the optical amplifier, the etalon, and the wavelength selectable mirror. The etalon has the wavelength peaks in transmission characteristics and transmits a light from the optical amplifier. The wavelength selectable mirror acts as an external mirror of an external cavity laser including the optical amplifier and having a relatively high reflection intensity at a part of wavelength range of the effective gain range of the optical amplifier. The effective gain range of the optical amplifier includes more than one wavelength peak of the etalon. A reflection bandwidth where the wavelength selectable mirror has a relatively high reflection intensity is less than twice of the wavelength interval of the wavelength peaks of the etalon.

In the method in accordance with the present invention, a light is amplified by the optical amplifier. The light from the optical amplifier has wavelength peaks at the wavelength interval when passing through the etalon. A light of a part of wavelength range in the effective gain range is reflected by the wavelength selectable mirror. The etalon is controlled so that wavelength peaks of a light passing through the etalon are within a range where an effective gain range of the optical amplifier and the reflection bandwidth of the wavelength selectable mirror are overlapped. In this case, the wavelength peaks of the light passing through the etalon are limited by the reflection of the wavelength selectable mirror. And, it is possible that the wavelength selectable mirror reflects one etalon peak, when the wavelength of the etalon peak is adjusted. The wavelength selection accuracy of outputting light is, therefore, improved.

The controlling step may be a step of controlling the etalon so that the range where the effective gain range of the optical amplifier and the reflection bandwidth of the wavelength selectable mirror are overlapped includes one of the wavelength peaks of the etalon and that the external cavity laser oscillates. In this case, the wavelength selection accuracy of outputting light is improved.

The controlling step may be a step of controlling an output light intensity of the external cavity laser to be a desirable value by detecting the output light intensity and by controlling a gain of the optical amplifier based on the output light intensity. In this case, it is possible to output a light having a desirable optical intensity.

The controlling step may be a step of controlling a wavelength of the output light of the external cavity laser to be a desirable value by detecting the wavelength of the output light and by controlling a refractive-index of the external cavity laser based on the detected wavelength of the output light. In this case, it is possible to output a light having a desirable wavelength.

The refractive-index of the external cavity laser may be controlled with a temperature of the etalon or the optical amplifier. In this case, it is possible to adjust peak wavelengths of the outputting light accurately. It is thus possible to improve the wavelength selection accuracy.

The external cavity laser may further include a phase sifter controlling a phase of a light passing therethrough when the refractive-index thereof changes. The refractive-index of the external cavity laser may be controlled by the phase shifter. In this case, it is possible to adjust peak wavelengths of the outputting light accurately. It is thus possible to improve the wavelength selection accuracy.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given of the best mode for carrying out the invention.

First Embodiment

Figure 1A:
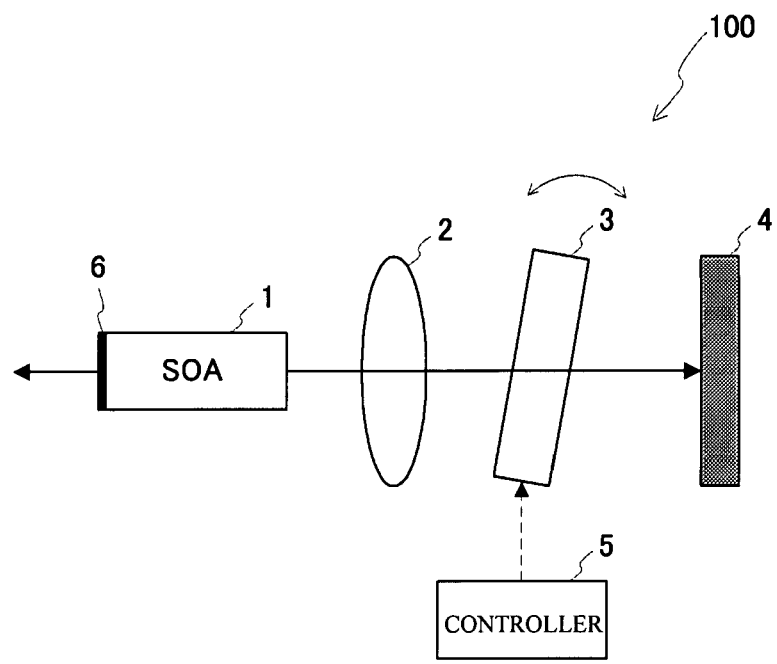
FIG. 1A and FIG. 1B illustrate a schematic view of an optical communication device in accordance with a first embodiment.
Figure 1B:
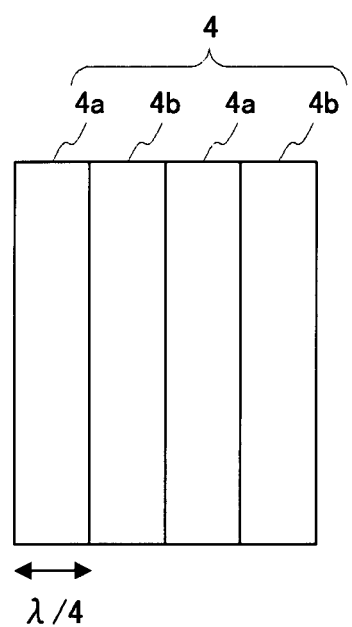

FIG. 1A and FIG. 1B illustrate a schematic view of an optical communication device in accordance with a first embodiment. FIG. 1A illustrates an overall view of the optical communication device. FIG. 1B illustrates a cross sectional view of a wavelength selectable mirror 4. As shown in FIG. 1A, a laser module 100 has a semiconductor optical amplifier 1, a lens 2, an etalon 3 and the wavelength selectable mirror 4. The optical communication device in accordance with the embodiment has the laser module 100 and a controller 5 controlling the laser module 100. The lens 2, the etalon 3 and the wavelength selectable mirror 4 are arranged backward of the semiconductor optical amplifier 1 in order.

The semiconductor optical amplifier 1 amplifies an incident light having a given effective wavelength range, and contributes a laser oscillation. A mirror 6 is arranged in front of the semiconductor optical amplifier 1. The laser light from the semiconductor optical amplifier 1 is reflected at the mirror 6 and is emitted to the lens 2 from a back face of the semiconductor optical amplifier 1. The lens 2 parallelizes an incident light. Therefore, the lens 2 parallelizes the laser light emitted from the back face of the semiconductor optical amplifier 1 and inputs the light to the etalon 3.

The etalon 3 is composed of a band-pass filter transmitting a light at a given wavelength interval. And a light incoming to the etalon 3 is emitted as a light having wavelength peaks at a given interval. Hereinafter, the wavelength peaks of transmission wavelengths of the etalon 3 are referred to etalon peaks. The etalon 3 changes wavelengths of the etalon peaks based on the inclination thereof with respect to the incident light. The etalon 3 receives an instruction from the controller 5 and changes the inclination thereof with respect to the incident light. The light passing through the etalon 3 is provided to the wavelength selectable mirror 4.

As shown in FIG. 1B, the wavelength selectable mirror 4 has, for example, a structure in which dielectric layers 4a composed of oxide silicon and dielectric layers 4b composed of oxide titanium are laminated one by one. The dielectric layers 4a and 4b have a desirable optical thickness (for example, $\lambda/4$). Here, "$\lambda$" means a central wavelength of a desirable light reflected by the wavelength selectable mirror 4. In this case, lights of wavelength $\lambda$ included in the light incoming to a boundary surface between the dielectric layers 4a and 4b enhance each other. Accordingly, a reflectivity of the lights of wavelength $\lambda$ is enhanced. In addition, lights of wavelength around $\lambda$ included in the light incoming to a boundary surface between the dielectric layers 4a and 4b are also enhanced each other. Accordingly, the wavelength selectable mirror 4 reflects lights in a wavelength range centering around $\lambda$. And the wavelength selectable mirror 4 reflects a laser light of incident laser lights from the lens 2, included in a desirable wavelength range.

The wavelength selectable mirror 4 may have an enhanced reflectivity in a given wavelength range and may reflect lights of wavelength around $\lambda/4$ which is substantially central wavelength. It is thus possible to combine the dielectric layers 4a and 4b optionally. In this case, the dielectric layer 4a may be composed of a material being same as that of the dielectric layer 4b and having a different refractive-index from that of the dielectric layer 4b.

The controller 5 receives a wavelength selection instruction (not shown in FIG. 1A and FIG. 1B) for selecting a given wavelength from outside. And the controller 5 controls the inclination of the etalon 3 in order to select wavelength. The controller 5 is not necessary, although the inclination of the etalon 3 is controlled by the controller 5 in the embodiment. For example, a user may adjust the inclination of the etalon 3.

Figure 2A:
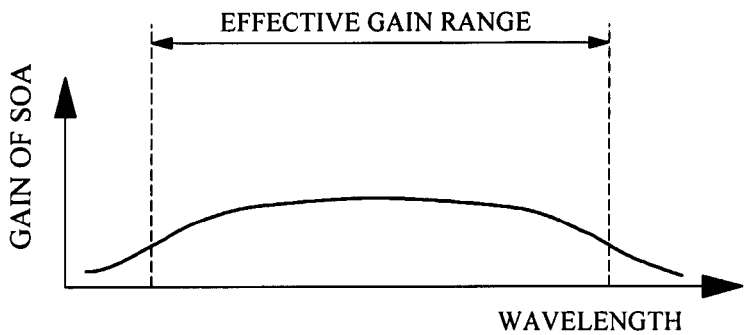
FIG. 2A through FIG. 2D illustrate a laser light resonating in a laser module.
Figure 2B:
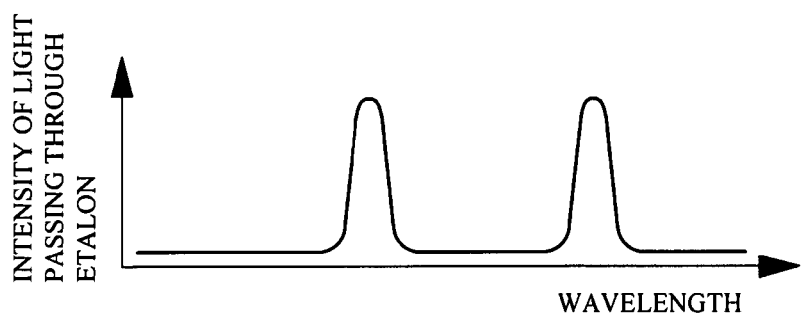
Figure 2C:
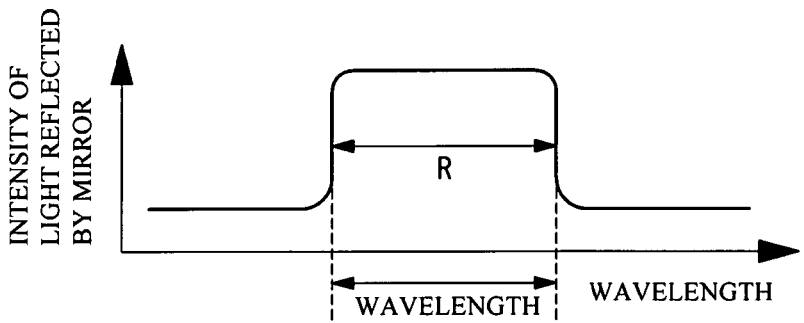
Figure 2D:
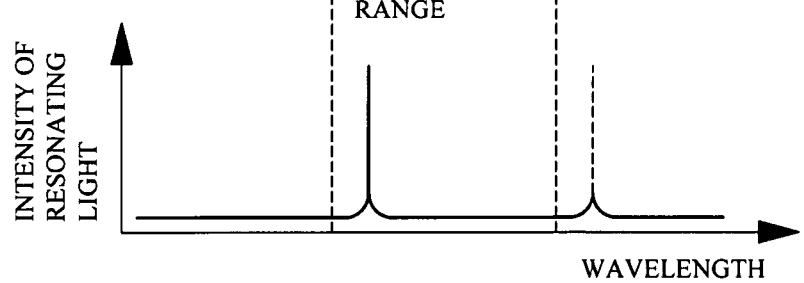

FIG. 2A through FIG. 2D illustrate a laser light resonating in the laser module 100. FIG. 2A illustrates a wavelength range of a laser light emitted from the semiconductor optical amplifier 1. FIG. 2B illustrates transmission characteristics of the etalon 3. FIG. 2C illustrates a wavelength range of a laser light reflected by the wavelength selectable mirror 4. FIG. 2D illustrates wavelength peaks of the laser light resonating in the laser module 100.

The horizontal axes of FIG. 2A through FIG. 2D indicate wavelength of the laser light. The vertical axis of FIG. 2A indicates a gain of the semiconductor optical amplifier (SOA) 1. The vertical axis of FIG. 2B indicates intensity of a light passing through the etalon 3. The vertical axis of FIG. 2C indicates intensity of the light reflected by the wavelength selectable mirror 4. The vertical axis of FIG. 2D indicates intensity of the laser light resonating in the laser module 100.

As shown in FIG. 2A, the gain of the laser light emitted from the semiconductor optical amplifier 1 has a given wavelength range. Hereinafter, a range, which is included in the given wavelength range and has more than a given gain value, is referred to an effective gain range. As shown at the solid line of FIG. 2B, a transmission wavelength of the etalon 3 has peaks at a given interval. The interval is referred to a Free Spectral Range. As shown in FIG. 2A and FIG. 2B, more than one transmission wavelength peak of the etalon 3 is included in the effective gain range, in the embodiment.

However, the wavelength selectable mirror 4 in accordance with the embodiment is structured so that intensity of the light reflected by the wavelength selectable mirror 4 is enhanced only in a given reflection bandwidth R, as shown in FIG. 2C.

It is thus possible that the reflection bandwidth includes one of the etalon peaks and one wavelength laser light resonates in the laser module 100, as shown in FIG. 2D. Accordingly, the selection accuracy of output wavelength of the laser module 100 is improved. The wavelength selectable mirror 4 may be structured so that the reflection bandwidth R is less than twice of the Free Spectral Range of the etalon 3 at a maximum, although the reflection bandwidth R of the wavelength selectable mirror 4 is within the effective gain range of the semiconductor optical amplifier 1 in the embodiment. In this case, it is possible that the reflection bandwidth R includes one of the etalon peaks, when the etalon 3 is controlled so that undesirable etalon peaks are out of the reflection bandwidth R. More than one etalon peak of the etalon 3 is always in both of the effective gain range of the semiconductor optical amplifier 1 and the reflection bandwidth R, when the reflection bandwidth R is more than twice of the Free Spectral Range of the etalon 3.

It is possible to control wavelength width of the reflection bandwidth R to be more than twice of the Free Spectral Range. In this case, more than one etalon peak of the etalon 3 are included in the reflection bandwidth R even if wavelengths of the etalon peaks of the etalon 3 are changed. However, the reflection bandwidth R includes one of the etalon peaks, when thicknesses of the dielectric layers 4a and 4b of the wavelength selectable mirror 4 are combined so that ends of the reflection bandwidth R are out of the effective gain range of the semiconductor optical amplifier 1 and a wavelength range where the reflection bandwidth R and the effective gain range are overlapped is less than twice of the Free Spectral Range. And a light resonating in the laser module 100 has one peak wavelength.

In the embodiment, the etalon has a structure in which the wavelengths of the etalon peaks changes based on the inclination thereof with respect to the incident light. However, an etalon, which has an etalon peak wavelength changing according to an applied voltage thereto, may be used. And an etalon, which has an etalon peak wavelength changing according to a temperature change thereof, may be used.

In the embodiment, the semiconductor optical amplifier 1 corresponds to the optical amplifier. The etalon 3 corresponds to the first etalon or the etalon.

Second Embodiment

Figure 3:
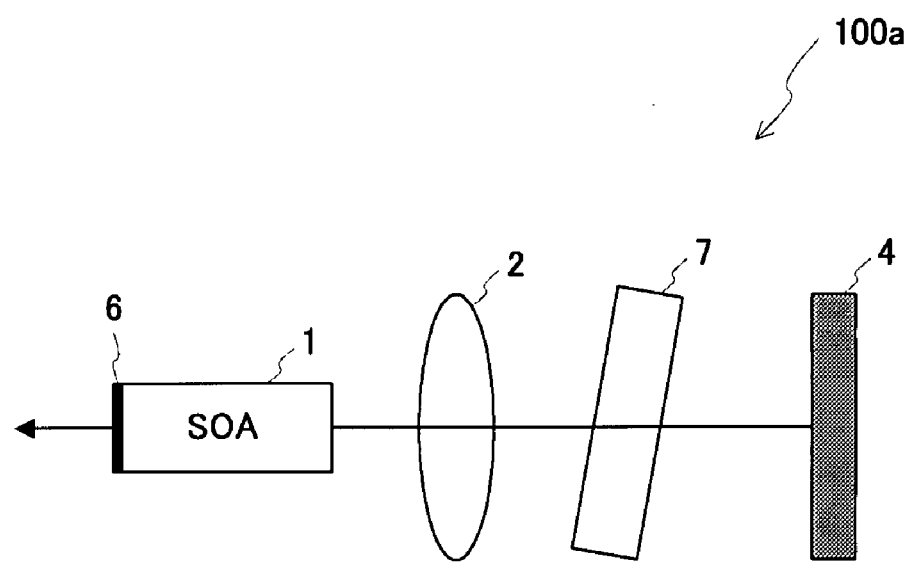
FIG. 3 illustrates a schematic view of a laser module in accordance with a second embodiment.

FIG. 3 illustrates a schematic view of a laser module 100a in accordance with a second embodiment. The laser module 100a is different from the laser module 100 in FIG. 1A in a point that a fixed etalon 7 is provided instead of the etalon 3. Here, the fixed etalon is an etalon having a fixed refractive-index. The fixed etalon 7 is fixed in the laser module 10a. A cavity length of the fixed etalon 7 is determined so that the etalon peaks of the fixed etalon 7 are within the reflection bandwidth R of the wavelength selectable mirror 4. The inclination of the fixed etalon 7 is determined so that the reflection bandwidth R of the wavelength selectable mirror 4 has one of the etalon peaks of the fixed etalon 7.

Figure 4A:
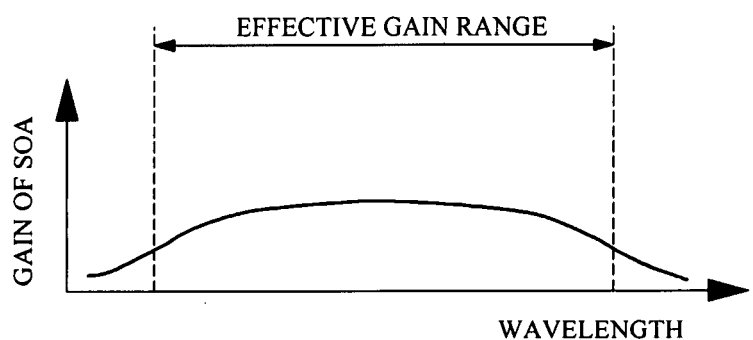
FIG. 4A thorough FIG. 4D illustrate a laser light resonating in a laser module.
Figure 4B:
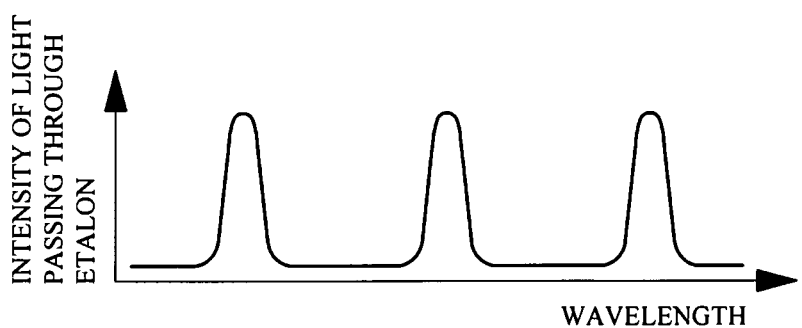
Figure 4C:
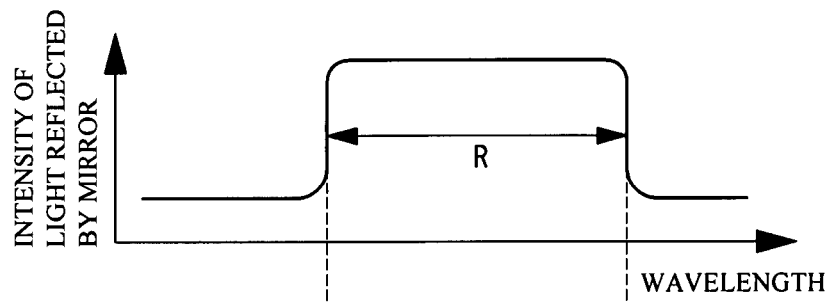
Figure 4D:
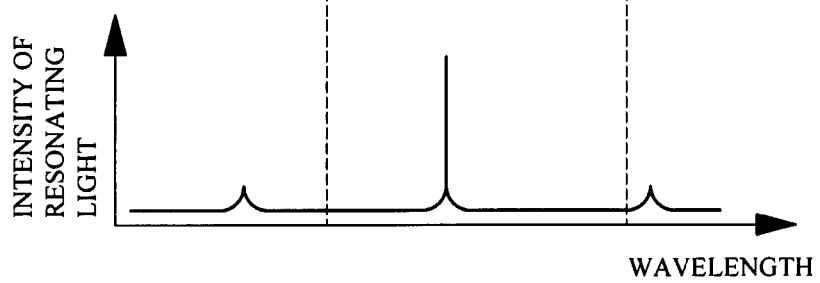

FIG. 4A thorough FIG. 4D illustrate a laser light resonating in the laser module 100a. FIG. 4A illustrates a wavelength range of a laser light emitted from the semiconductor optical amplifier 1. FIG. 4B illustrates transmission characteristics of the fixed etalon 7. FIG. 4C illustrates a wavelength range of a laser light reflected by the wavelength selectable mirror 4. FIG. 4D illustrates wavelength peaks of the laser light resonating in the laser module 100a.

The horizontal axes of FIG. 4A through FIG. 4D indicate wavelength of the laser light. The vertical axis of FIG. 4A indicates a gain of the semiconductor optical amplifier 1. The vertical axis of FIG. 4B indicates intensity of the light passing through the fixed etalon 7. The vertical axis of FIG. 4C indicates intensity of the light reflected by the wavelength selectable mirror 4. The vertical axis of FIG. 4D indicates intensity of the laser light resonating in the laser module 100a.

As shown in FIG. 4B, the reflection bandwidth R of the wavelength selectable mirror 4 shown in FIG. 4C includes one etalon peak of the fixed etalon 7. Therefore, the light resonating in the laser module 100a has one peak wavelength, as shown in FIG. 4D. Accordingly, the selection accuracy of output wavelength of the laser module 100a is improved.

A fixed etalon having a cavity length different from that of the fixed etalon 7 may be used instead of the fixed etalon 7. It is possible to determine the inclination of the fixed etalon 7 when the fixed etalon 7 is fixed in the laser module 100a. Therefore, it is possible to set an output wavelength of the laser module 100a optionally. In addition, it is possible to adjust the output wavelength of the laser module 100a by using a temperature control device 60 mentioned later.

It is not necessary to provide a space and a drive unit to change the inclination of the fixed etalon 7, because the fixed etalon 7 is fixed in the laser module 100a. The structure of the laser module 100a is thus simplified.

In the embodiment, the fixed etalon 7 corresponds to the etalon.

Third Embodiment

Figure 5:
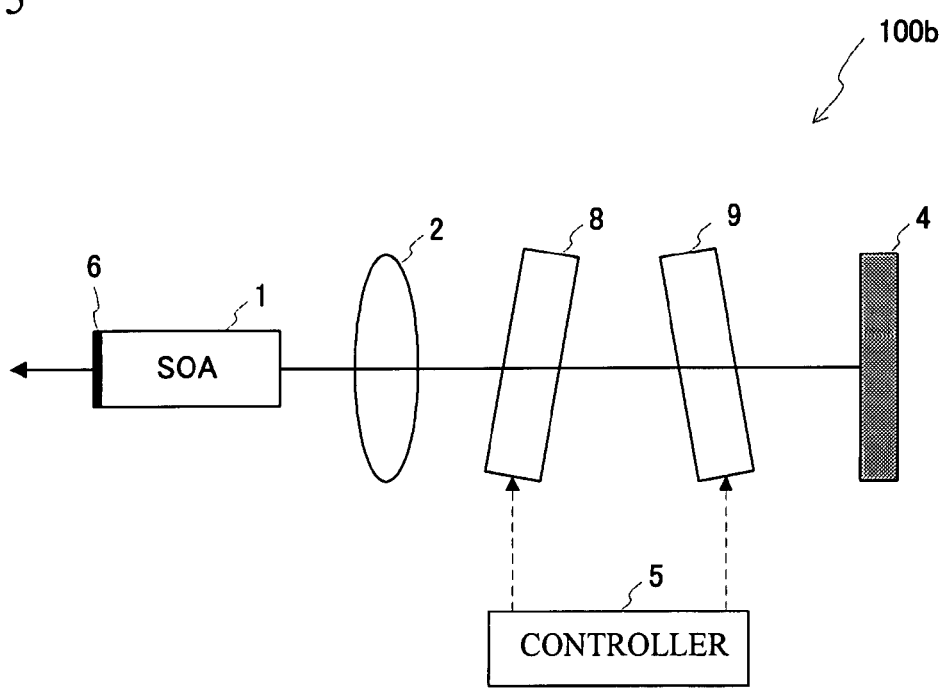
FIG. 5 illustrates a schematic view of an optical communication device in accordance with a third embodiment.

FIG. 5 illustrates a schematic view of an optical communication device in accordance with a third embodiment. A laser module 100b employed for the optical communication device is different from the laser module 100 in FIG. 1 in a point that liquid crystal etalons 8 and 9 are provided instead of the etalon 3. The lens 2, the liquid crystal etalon 8, the liquid crystal etalon 9, and the wavelength selectable mirror 4 are arranged backward of the semiconductor optical amplifier 1 in order, in the laser module 100b.

The liquid crystal etalons 8 and 9 are composed of a liquid crystal band-pass filter transmitting a light at a given wavelength interval. The refractive-indexes of the liquid crystal etalon 8 and 9 change according to a voltage applied thereto by the controller 5. The etalon peak wavelengths of the liquid crystal etalons 8 and 9 change according to the refractive-index thereof.

Figure 6A:
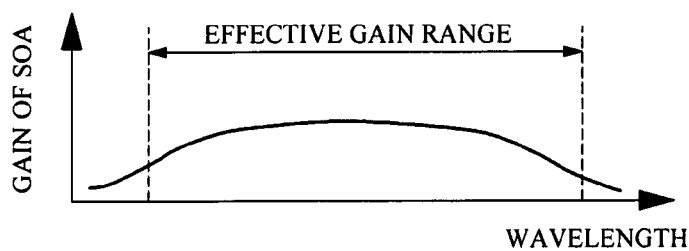
FIG. 6A through FIG. 6F illustrate a laser light resonating in a laser module.
Figure 6B:
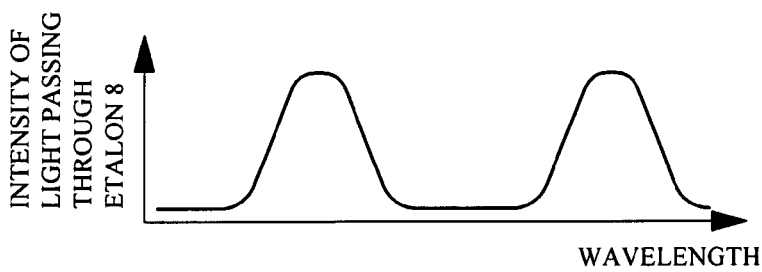
Figure 6C:
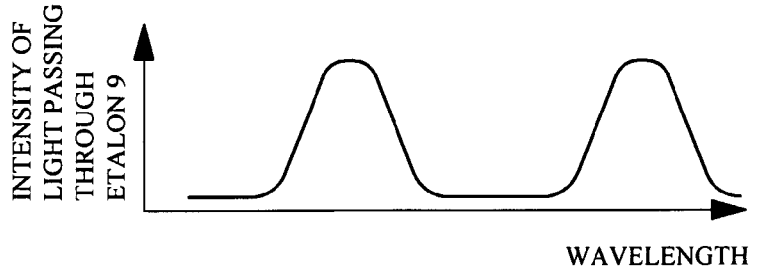
Figure 6D:
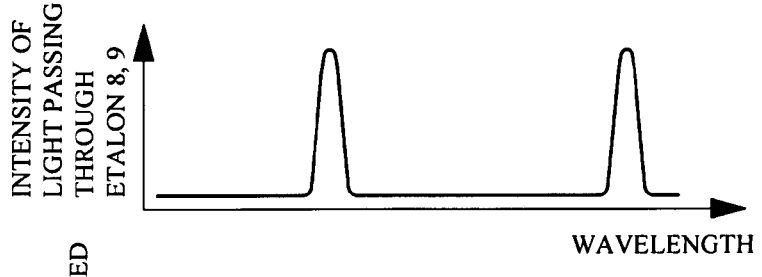
Figure 6E:
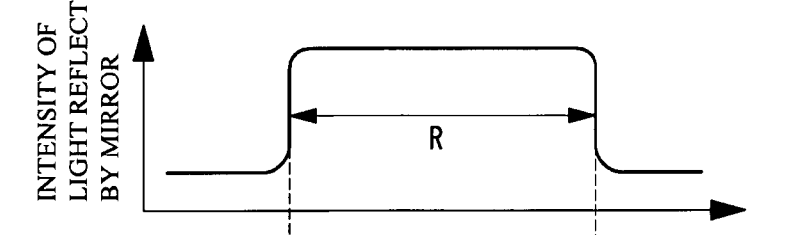
Figure 6F:
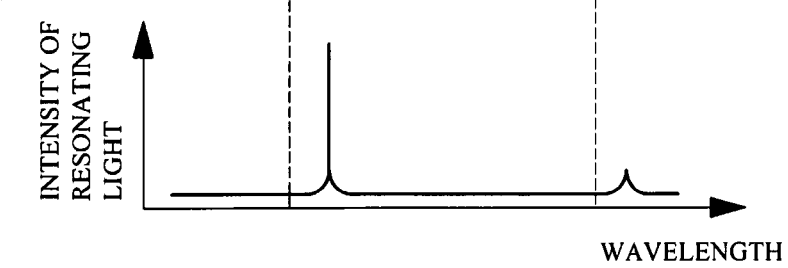

FIG. 6A through FIG. 6F illustrate a laser light resonating in the laser module 100b. FIG. 6A illustrates a wavelength range of a laser light emitted from the semiconductor optical amplifier 1. FIG. 6B illustrates transmission characteristics of the liquid crystal etalon 8. FIG. 6C illustrates transmission characteristics of the liquid crystal etalon 9. FIG. 6D illus-
trates a combined light passing through the liquid crystal etalons 8 and 9. FIG. 6E illustrates a wavelength range of a laser light reflected from the wavelength selectable mirror 4. FIG. 6F illustrates wavelength peaks of the laser light resonating in the laser module 100b.

The horizontal axes of FIG. 6A through FIG. 6F indicate wavelength of the laser light. The vertical axis of FIG. 6A indicates a gain of the semiconductor optical amplifier 1. The vertical axis of FIG. 6B indicates intensity of a light passing through the liquid crystal etalon 8. The vertical axis of FIG. 6C indicates intensity of a light passing through the liquid crystal etalon 9. The vertical axis of FIG. 6D indicates intensity of a light passing through the liquid crystal etalons 8 and 9. The vertical axis of FIG. 6E indicates intensity of the light reflected by the wavelength selectable mirror 4. The vertical axis of FIG. 6F indicates intensity of the laser light resonating in the laser module 100b.

As shown in FIG. 6B, FIG. 6C and FIG. 6E, the Free Spectral Ranges of the liquid crystal etalons 8 and 9 are set so as to be wider than the reflection bandwidth R of the wavelength selectable mirror 4. In this case, a half-value width of the wavelength peak of the light passing through the liquid crystal etalons 8 and 9 is enlarged.

The controller 5 controls the voltages applied to the liquid crystal etalons 8 and 9 so that at least a part of the etalon peaks of a light passing through the liquid crystal etalon 8 and at least a part of the etalon peaks of a light passing through the liquid crystal etalon 9 are overlapped. Therefore, the half-value width of the wavelength peak of the laser light combined of the lights passing through the liquid crystal etalons 8 and 9 is reduced. In addition, the laser module 100b allows one peak wavelength of a laser light as shown in FIG. 6F, because the Free Spectral Ranges of the liquid crystal etalons 8 and 9 are set so as to be wider than the reflection bandwidth R of the wavelength selectable mirror 4. Accordingly, the selection accuracy of the output wavelength of the laser module 100b is improved.

Another etalon may be used instead of the liquid crystal etalons 8 and 9, although the liquid crystal etalons 8 and 9 are used in the embodiment. For example, more than one etalon 3 in FIG. 1 may be used instead of the liquid crystal etalons 8 and 9. In addition, fixed etalons having etalon peaks shown in FIG. 6B and FIG. 6C may be used. More than one etalon having etalon peaks changing according to temperature changing thereof may be used.

In the embodiment, the liquid crystal etalon 8 corresponds to the first etalon or the etalon. The liquid crystal etalon 9 corresponds to the second etalon.

Fourth Embodiment

Next, a description will be given of an optical communication device in accordance with a fourth embodiment. The optical communication device in accordance with the fourth embodiment has a same structure as that of FIG. 5. And the Free Spectral Ranges of the liquid crystal etalons 8 and 9 of the laser module 100b are different from each other. In the embodiment, the wavelength is selected with a vernier effect. A detail description will be given.

Figure 7A:
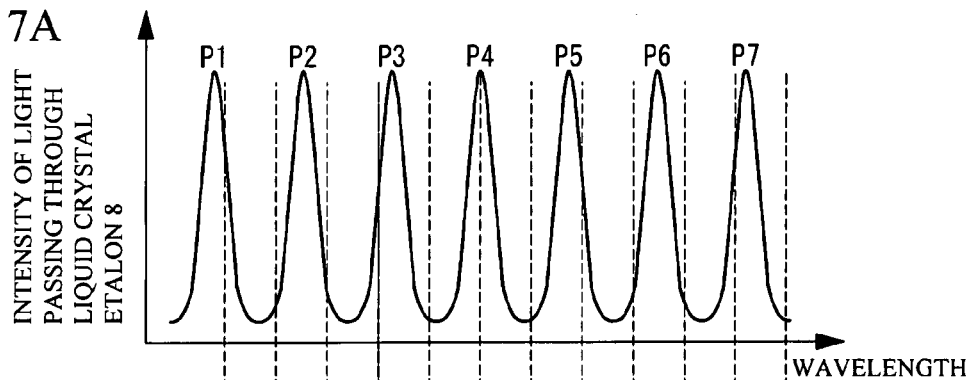
FIG. 7A through FIG. 7C illustrate another laser light resonating in a laser module.
Figure 7B:
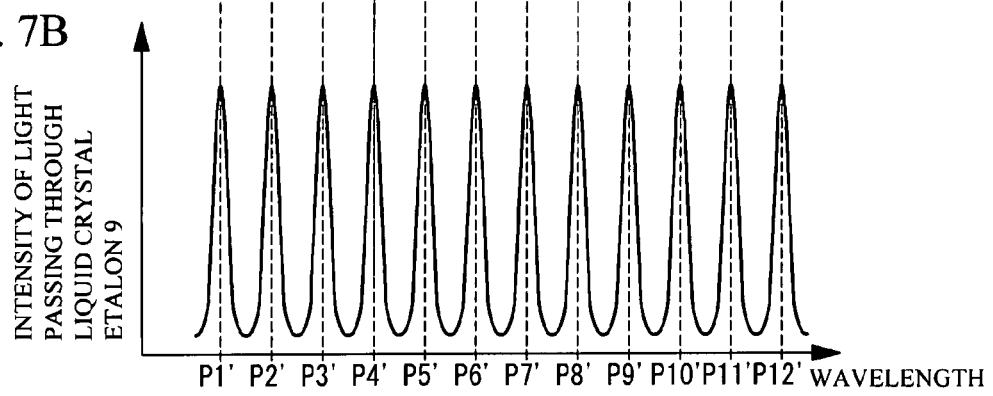
Figure 7C:
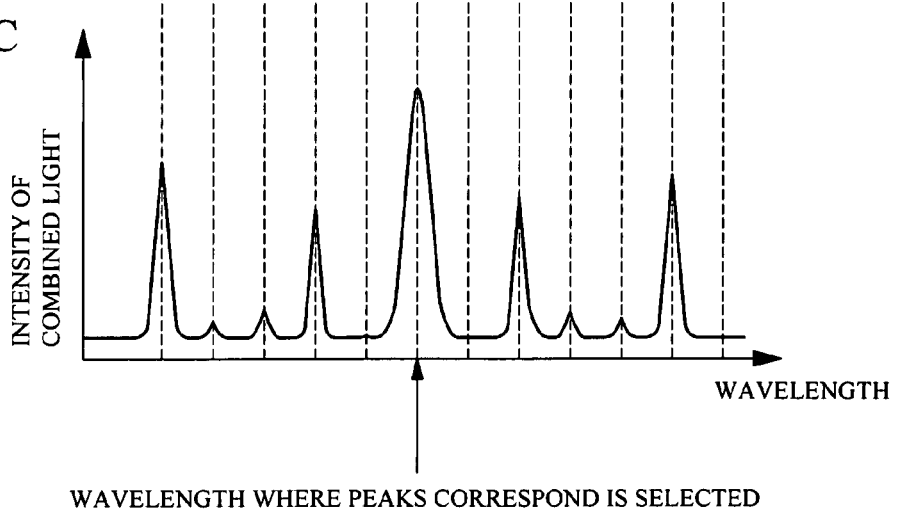

FIG. 7A through FIG. 7C illustrate another laser light resonating in the laser module 100b. FIG. 7A illustrates transmission characteristics of the liquid crystal etalon 8. FIG. 7B illustrates transmission characteristics of the liquid crystal etalon 9. FIG. 7C illustrates wavelength peaks of the laser light resonating in the laser module 100b.

The horizontal axes of FIG. 7A through FIG. 7C indicate wavelength of the laser light. The vertical axis of FIG. 7A indicates intensity of a light passing through the liquid crystal etalon 8. The vertical axis of FIG. 7B indicates intensity of a light passing through the liquid crystal etalon 9. The vertical axis of FIG. 7C indicates intensity of a light passing through the liquid crystal etalons 8 and 9.

As shown in FIGS. 7A and 7B, the Free Spectral Range of the liquid crystal etalon 8 is different from that of the liquid crystal etalon 9. Therefore, wavelengths, where the etalon peaks of the liquid crystal etalon 8 correspond to those of the liquid crystal etalon 9, change when the relative relationship between the etalon peaks of the liquid crystal etalons 8 and 9 changes. It is possible to select a wavelength from all of the etalon peaks of the liquid crystal etalons 8 and 9 within the reflection bandwidth R in principle with a relative changing of the wider one of the Free Spectral Ranges of the liquid crystal etalon 8 and 9, because the resonating light wavelength where the etalon peaks of the liquid crystal etalon 8 correspond to those of the liquid crystal etalon 9 is selected. It is, therefore, possible to select a wavelength from a wide bandwidth by using a little tunable bandwidth. In the embodiment, the Free Spectral Ranges of the liquid crystal etalons 8 and 9 are set so that the reflection bandwidth R of the wavelength selectable mirror 4 has one wavelength where the etalon peak of the liquid crystal etalon 8 correspond to that of the liquid crystal etalon 9. Therefore, the laser module 100*b* allows one peak wavelength of the resonating laser light. Accordingly, the selection accuracy of the output wavelength of the laser module 100*b* is improved.

In the embodiment, the liquid crystal etalon 8 corresponds to the first etalon or the etalon. The liquid crystal etalon 9 corresponds to the second etalon. It is possible to select a wavelength of a resonating light by changing etalon peaks of one liquid crystal etalon, although each of the etalon peaks of liquid crystal etalons is changed in the embodiment. It is possible to control the wavelength by the vernier effect with a fixed etalon arranged instead of one liquid crystal etalon.

Fifth Embodiment

Figure 8:
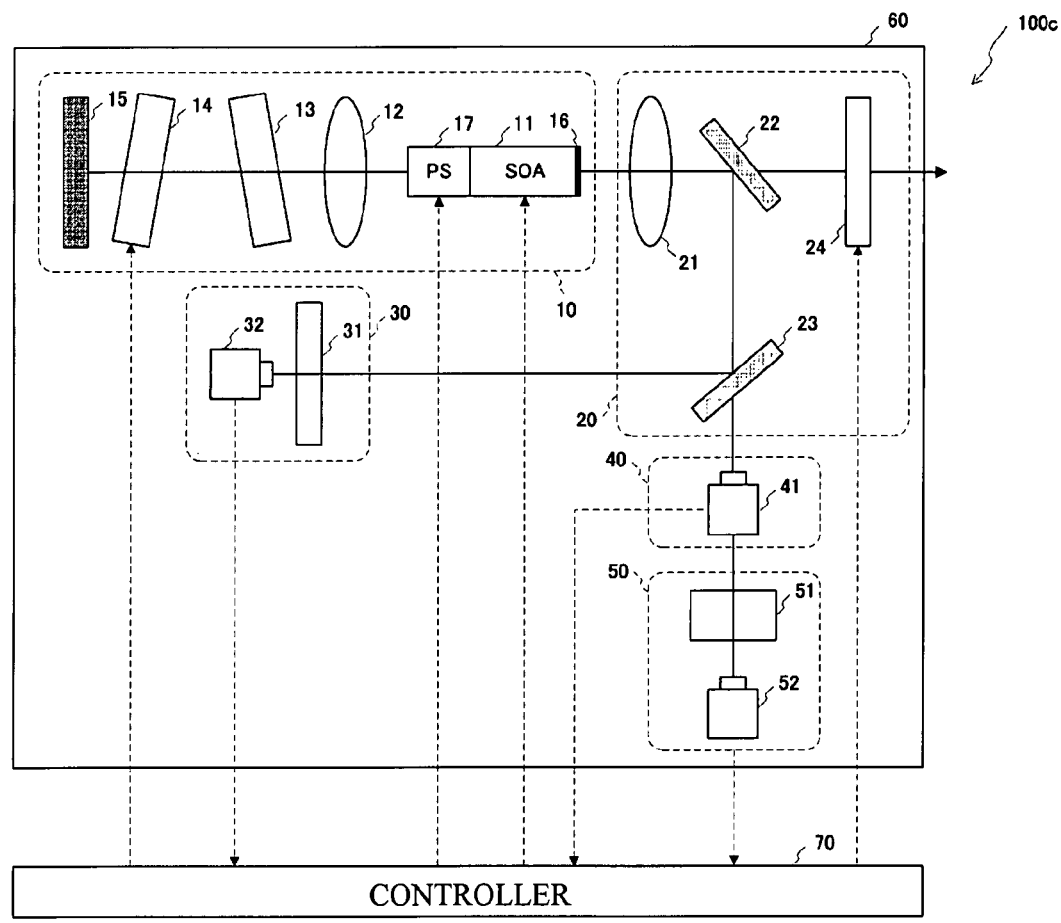
FIG. 8 illustrates a schematic view of a whole structure of an optical communication device in accordance with a fifth embodiment.

FIG. 8 illustrates a schematic view of an overall structure of an optical communication device in accordance with a fifth embodiment. A laser module 100*c* has an external cavity laser 10, an output portion 20, an initial wavelength monitor 30, a power monitor 40, a wavelength locker 50 and the temperature control device 60. The optical communication device in accordance with the embodiment has the laser module 100*c* and a controller 70 controlling the laser module 100*c*.

The external cavity laser 10 has a semiconductor optical amplifier 11, a lens 12, a fixed etalon 13, a liquid crystal etalon 14 and a wavelength selectable mirror 15. The lens 12, the fixed etalon 13, the liquid crystal etalon 14 and the wavelength selectable mirror 15 are arranged backward of the semiconductor optical amplifier 11 in order.

The semiconductor optical amplifier 11 receives an instruction from the controller 70. And the semiconductor optical amplifier 11 amplifies an incident light having a given effective wavelength range, and outputs a laser light. A mirror 16 is provided in front of the semiconductor optical amplifier 11. A phase shifter 17 is provided backward of the semiconductor optical amplifier 11. A waveguide of the phase shifter 17 and that of the semiconductor optical amplifier 11 are coupled to each other, and the phase shifter 17 and the semiconductor optical amplifier 11 are integrated on a chip. The refractive-index of the phase shifter 17 changes according to a current provided from the controller 70. A phase of a peak wavelength of a light passing through the phase shifter 17 changes when the refractive-index of the phase shifter 17 changes.

The lens 12 parallelizes the laser light emitted from the semiconductor optical amplifier 11 and inputs the light to the fixed etalon 13, in the same way as the lens 2. The fixed etalon 13 is composed of a band-pass filter transmitting a light at a given wavelength interval. And a light incoming to the fixed etalon 13 is emitted as a light having wavelength peaks at a given interval. The fixed etalon 13 is fixed on the temperature control device 60. The fixed etalon 13 generates 88-channel wavelength in a C-band. Specifically, the Free Spectral Range of the fixed etalon 13 is set approximately 0.4 nm so that the 88-channel wavelength is generated in a range 1528 nm to 1563 nm (bandwidth is 35 nm) in the C-band.

The liquid crystal etalon 14 is composed of a liquid crystal band-pass filter transmitting a light at a given wavelength interval. The refractive-index of the liquid crystal etalon 14 changes according to the voltage applied by the controller 70. The etalon peak wavelengths of the liquid crystal etalon 14 change according to the refractive-index thereof. The wavelength selectable mirror 15 in accordance with the embodiment has a same structure as the wavelength selectable mirror 4 in FIG. 1A and FIG. 1B. In the embodiment, the reflection bandwidth R of the wavelength selectable mirror 15 is set 36 nm so as to cover the 88-channel bandwidth. The Free Spectral Range of the liquid crystal etalon 14 is set more than 36 nm (the reflection bandwidth R of the wavelength selectable mirror 15), because it is necessary that only one etalon peak of the liquid crystal etalon 14 is included in the reflection bandwidth of the wavelength selectable mirror 15.

Etalon peaks at a given wavelength interval of a liquid crystal etalon is set so that the Free Spectral Range thereof corresponds to a tunable range of the etalon peaks. That is, the tunable range of the liquid crystal etalon 14 covers all of the reflection bandwidth of the wavelength selectable mirror 15, because the Free Spectral Range of the liquid crystal etalon 14 is wider than the reflection bandwidth R of the wavelength selectable mirror 15, as mentioned above.

The output portion 20 has a lens 21, beam splitters 22 and 23, and a shutter 24. A laser light emitted from the external cavity laser 10 is fed into the lens 21. The lens 21 parallelizes the laser light emitted from the external cavity laser 10 and inputs the light to the beam splitter 22.

The beam splitter 22 transmits a part of the laser light from the lens 21 and inputs the light to the shutter 24. The beam splitter 22 reflects a part of the laser light from the lens 21 and inputs the light to the beam splitter 23. The shutter 24 may be a shutter transmitting and shutting a light when a voltage is applied to a liquid crystal thereof. The shutter 24 receives an instruction from the controller 70. And the shutter 24 transmits to outside and shuts the laser light from the beam splitter 22. It is possible to stop outputting of an unstable laser light from the laser module 100*c* when a wavelength, an output power, a phase and so on of the laser light are adjusted. The beam splitter 23 transmits a part of an incident laser light and inputs the light to the power monitor 40. And the beam splitter 23 reflects a part of the incident laser light and inputs the light to the initial wavelength monitor 30.

The power monitor 40 acts as an optical intensity detection portion measuring intensity of an output light, and has an optical detector element 41. The optical detector element 41 measures an optical intensity of a laser light from the beam splitter 23 and inputs the measured value to the controller 70. The controller 70 controls a gain of the semiconductor optical amplifier 11 based on the measured value from the optical detector element 41. A part of the laser light from the optical detector element 41 is input to the wavelength locker 50.

The wavelength locker 50 acts as a wavelength detection portion measuring an output wavelength, and has a locking etalon 51 and an optical detector element 52. A part of the laser light input to the optical detector element 41 is input to the locking etalon 51. The laser light fed into the locking etalon 51 is input to the optical detector element 52 as a laser light having wavelength peaks at a given interval. The optical detector element 52 measures optical intensity of the laser light from the locking etalon 51 and inputs the measured value to the controller 70. The controller 70 calculates a wavelength of the laser light from the external cavity laser 10 based on the measured value from the optical detector element 52. In addition, the controller 70 controls a refractive-index of the phase shifter 17 based on the calculation result so that the phase of the peak wavelength laser light from the external cavity laser 10 is adjusted to a desirable value.

The initial wavelength monitor 30 has a filter 31 and an optical detector element 32. The filter 31 converts absolute wavelength information of the laser light from the beam splitter 23 to intensity information, and inputs the intensity information to the optical detector element 32. A current value of the semiconductor optical amplifier 11 is controlled based on the output of the optical detector element 41 so that a desirable optical output is obtained. The optical detector element 32 measures the optical intensity of the laser light from the filter 31 and inputs the measured value to the controller 70. The controller 70 controls a voltage to be applied to the liquid crystal etalon 14 based on the measured value from the optical detector element 32 so that the output value of the optical detector element 32 corresponds to an initial wavelength of a desirable channel. The controller 70 can calculate the wavelength of the laser light from the external cavity laser 10 accurately based on the measured value of the optical detector element 52.

The external cavity laser 10, the output portion 20, the initial wavelength monitor 30, the power monitor 40 and the wavelength locker 50 are arranged on the temperature control device 60. The temperature control device 60 receives an instruction from the controller 70, and maintains a constant temperature. Therefore, the temperature of the laser module 100c is maintained constant and the wavelength of the laser light from the laser module 100c is stabilized. The temperature control device 60 has a temperature sensor (not shown in FIG. 8). The temperature sensor inputs the temperature of the temperature control device 60 to the controller 70. It is possible to control the etalon peaks of the liquid crystal etalon 14 and the locking etalon 51 by controlling the temperature of the temperature control device 60.

Figure 9A:
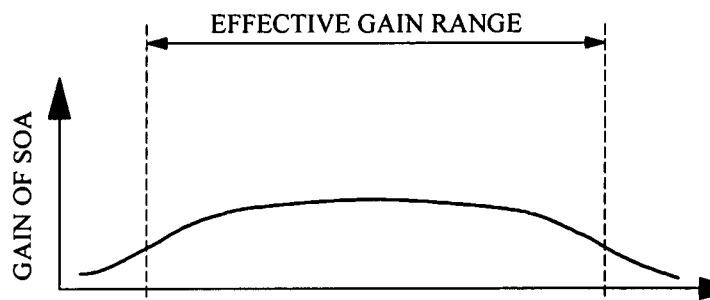
FIG. 9A through FIG. 9E illustrate a laser light resonating in a laser module.
Figure 9B:
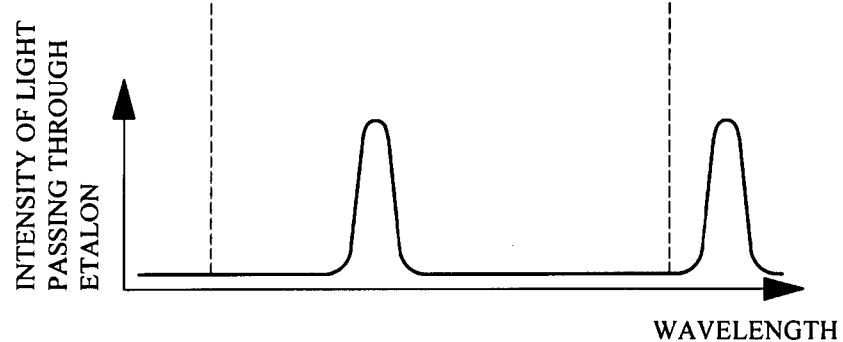
Figure 9C:
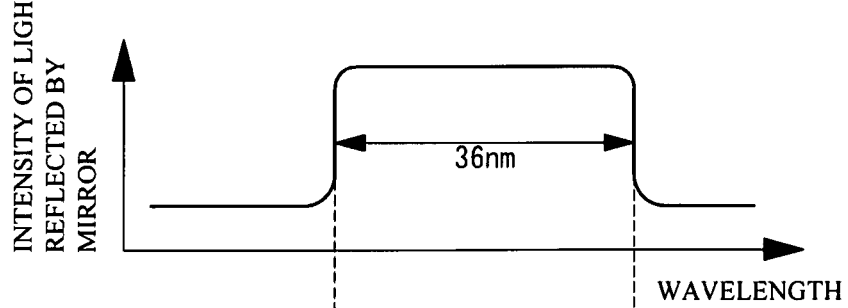
Figure 9D:
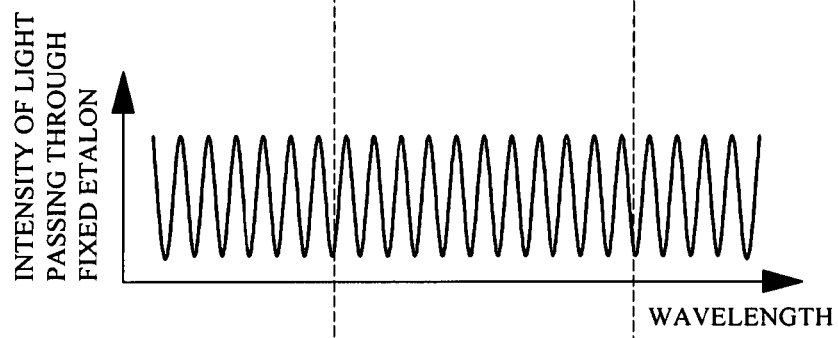
Figure 9E:
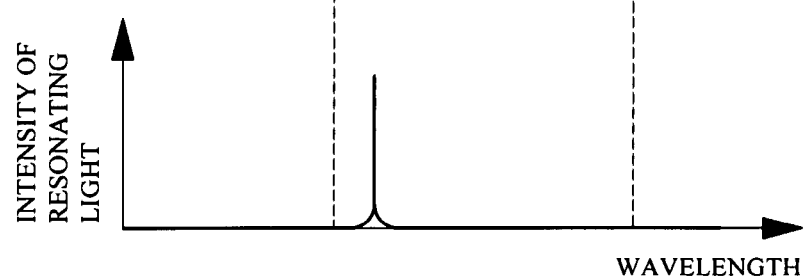

FIG. 9A through FIG. 9E illustrate a laser light resonating in the laser module 100c. FIG. 9A illustrates a wavelength range of a laser light from the semiconductor optical amplifier 11. FIG. 9B illustrates transmission characteristics of the liquid crystal etalon 14. FIG. 9C illustrates a wavelength range of a laser light reflected by the wavelength selectable mirror 15. FIG. 9D illustrates transmission characteristics of the fixed etalon 13. FIG. 9E illustrates wavelength peaks of the laser light resonating in the laser module 100c.

The horizontal axes of FIG. 9A through FIG. 9E indicate wavelength of the laser light. The vertical axis of FIG. 9A indicates a gain of the semiconductor optical amplifier 11. The vertical axis of FIG. 9B indicates intensity of a light passing through the liquid crystal etalon 14. The vertical axis of FIG. 9C indicates intensity of the light reflected by the wavelength selectable mirror 15. The vertical axis of FIG. 9D indicates intensity of a light passing through the fixed etalon 13. The vertical axis of FIG. 9E indicates intensity of the laser light resonating in the laser module 100c.

As shown in FIG. 9E, the selection accuracy of the output wavelength in the laser module 100c is improved, because a wavelength is selected when an etalon peak of the fixed etalon 13 corresponds to that of the liquid crystal etalon 14.

Figure 10A:
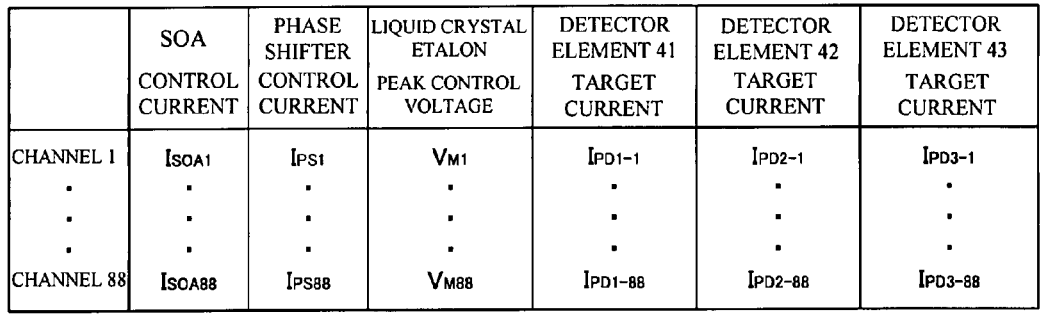
FIG. 10A through FIG. 10C illustrate a control data of a laser module.
Figure 10B:
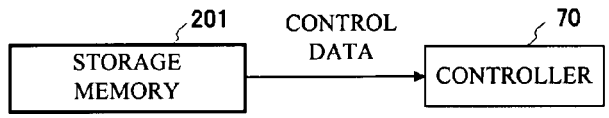
Figure 10C:
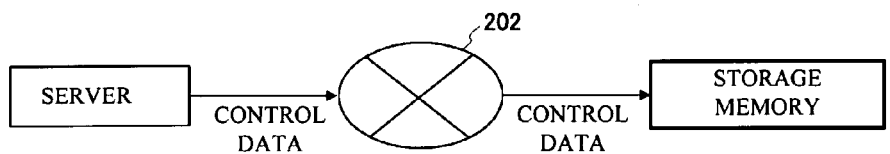

FIG. 10A through FIG. 10C illustrate a control data 200 of the laser module 100c. FIG. 10A illustrates a table of the control data 200. FIG. 10B illustrates a storage media storing the control data 200. FIG. 10C illustrates an aspect in which the control data 200 is transmitted to a user.

As shown in FIG. 10A, the control data 200 has a control current of the semiconductor optical amplifier 11, a control current of the phase shifter 17, a control voltage of the liquid crystal etalon 14 and target currents of the optical detector elements 32, 41 and 52 at every channel. These data are measured and stored in advance when the laser module 100c oscillates at a desirable wavelength. Each of the currents and each of the voltages are set at every channel of the fixed etalon 13. The control data 200 is referred when a given channel is instructed by a wavelength selection instruction. The control data 200 is used for a control of the semiconductor optical amplifier 11, the phase shifter 17 and the liquid crystal etalon 14 by the controller 70. It is possible to control the wavelength of the laser light from the laser module 100c easily, because it is possible to control the laser module 100c based on the control data 200 set in advance.

As shown in FIG. 10B, the control data 200 is stored in a storage memory 201. A portable media such as a semiconductor memory, a magnetic disk or a CD-ROM is used as the storage memory 201. The controller 70 in FIG. 8 uses the control data 200 stored in the storage memory 201 and controls the wavelength of the laser light emitted from the laser module 100c. As shown in FIG. 10C, the control data 200 is stored in a storage media prepared by the user in advance through an electrical transmitting means such as an Internet 202.

In the embodiment, the liquid crystal etalon 14 corresponds to the first etalon or the etalon. The fixed etalon 13 corresponds to the second etalon. The semiconductor optical amplifier 11 corresponds to the optical amplifier. The phase shifter 17 corresponds to the phase shifter. The optical detector element 52 corresponds to the optical intensity detector.

What is claimed is:

1. A laser module comprising:
 an optical amplifier;
 a first etalon that has a wavelength peaks at a given wavelength interval in transmission characteristics and that transmits a light from the optical amplifier,
 the wavelength peaks being tunable;
 a wavelength selectable mirror that acts as an external mirror of an external cavity laser including the optical amplifier and that has a relatively high reflection intensity at a part of wavelength range in an effective gain range of the optical amplifier,
 the effective gain range of the optical amplifier including more than one wavelength peak of the first etalon,
 the wavelength range being smaller than the wavelength interval of the wavelength peaks of the first etalon,
 only one peak of the first etalon being included in the part of wavelength range of the wavelength selectable mirror; and
 a second etalon that has a wavelength peaks at a given wavelength interval in transmission characteristics and is arranged between the optical amplifier and the wavelength selectable mirror,
 the wavelength peaks of the second etalon being fixed.

2. The laser module as claimed in claim 1, wherein the wavelength selectable mirror has a structure in which dielectric layers are laminated, the dielectric layers having a thickness of substantially ¼ of a central wavelength of a desirable reflected light.

3. The laser module as claimed in claim 1, wherein the wavelength peaks of the first etalon change when an inclination of the first etalon with respect to an incident light changes.

4. The laser module as claimed in claim 1, wherein:
the first etalon has a liquid crystal that has a refractive-index changing based on a voltage applied thereto; and
the wavelength peaks of the first etalon change based on the voltage applied to the first etalon.

5. The laser module as claimed in claim 1, wherein the wavelength interval of etalon peaks of the second etalon are different from those of the first etalon.

6. The laser module as claimed in claim 1, wherein the optical amplifier is a semiconductor optical amplifier.

7. The laser module as claimed in claim 1, further comprising a phase shifter that is arranged between the optical amplifier and the wavelength selectable mirror and controls a phase of a light passing therethrough when a refractive-index thereof is changed.

8. The laser module as claimed in claim 7, wherein the phase shifter is composed of a semiconductor integrated with the optical amplifier as a unit.

9. The laser module as claimed in claim 1, further comprising a temperature control device having the optical amplifier, the wavelength selectable mirror and the first etalon arranged thereon.

10. The laser module as claimed in claim 7, further comprising a wavelength detection portion that detects an output wavelength of the external cavity laser,
wherein a refractive-index of the phase shifter changes according to a detection result of the wavelength detection portion.

11. The laser module as claimed in claim 1, further comprising a shutter that transmits or shuts an outputting light.

12. The laser module as claimed in claim 11, wherein the shutter has a liquid crystal and transmits or shuts an outputting light according to a voltage applied on the liquid crystal.

13. The laser module as claimed in claim 1, wherein:
the reflection bandwidth includes one peak wavelength of a light passing through the first etalon and one peak wavelength of a light passing through the second etalon; and
at least a part of the light passing through the first etalon and at least a part of the light passing through the second etalon are overlapped in the reflection bandwidth.

14. A method of controlling wavelength of an external cavity laser comprising a step of controlling a first etalon so that peak wavelengths at a given wavelength interval of the first etalon is within a range where an effective gain range of an optical amplifier and a reflection bandwidth of a wavelength selectable mirror are overlapped and so that the external cavity laser oscillates,
the external cavity laser having the optical amplifier, the first etalon, a second etalon and the wavelength selectable mirror,
the first etalon having the wavelength peaks in transmission characteristics and transmitting a light from the optical amplifier,
the wavelength selectable mirror acting as an external mirror of an external cavity laser including the optical amplifier and having a relatively high reflection intensity at a part of wavelength range of the effective gain range of the optical amplifier,
the effective gain range of the optical amplifier including more than one wavelength peak of the first etalon,
the wavelength range being smaller than the wavelength interval of the wavelength peaks of the first etalon,
only one peak of the first etalon being included in the part of wavelength range of the wavelength selectable mirror; and
the second etalon having a wavelength peaks at a given wavelength interval in transmission characteristics and being arranged between the optical amplifier and the wavelength selectable mirror,
the wavelength peaks of the second etalon being fixed.

15. The method as claimed in claim 14, wherein the controlling step is a step of controlling the first etalon so that the range where the effective gain range of the optical amplifier and the reflection bandwidth of the wavelength selectable mirror are overlapped includes one of the wavelength peaks of the first etalon and so that the external cavity laser oscillates.

16. The method as claimed in claim 14, wherein the controlling step is a step of controlling an output light intensity of the external cavity laser to be a desirable value by detecting the output light intensity and by controlling a gain of the optical amplifier based on the output light intensity.

17. The method as claimed in claim 14, wherein the controlling step is a step of controlling a wavelength of the output light of the external cavity laser to be a desirable value by detecting the wavelength of the output light and by controlling a refractive-index of the external cavity laser based on the detected wavelength of the output light.

18. The method as claimed in claim 17, wherein the refractive-index of the external cavity laser is controlled with a temperature of the first etalon or the optical amplifier.

19. The method as claimed in claim 17, wherein:
the external cavity laser further has a phase shifter controlling a phase of a light passing therethrough when the refractive-index thereof changes; and
the refractive-index of the external cavity laser is controlled by the phase shifter.

* * * * *